United States Patent [19]

Gontowski, Jr.

[11] Patent Number: 4,720,689

[45] Date of Patent: Jan. 19, 1988

[54] HIGH FREQUENCY PRECISION OSCILLATOR WITH SYNCHRONOUS CAPABILITY

[75] Inventor: Walter S. Gontowski, Jr., Thompson, Conn.

[73] Assignee: Cherry Semiconductor Corporation, East Greenwich, R.I.

[21] Appl. No.: 12,887

[22] Filed: Feb. 10, 1987

[51] Int. Cl.⁴ ............................................. H03K 3/282
[52] U.S. Cl. ................................. 331/111; 331/113 R
[58] Field of Search ................ 331/108 D, 111, 143, 331/113 R; 307/260; 328/67, 68

[56] References Cited

U.S. PATENT DOCUMENTS 4,407,588 10/1983 Arichi et al. ................ 331/111 X
4,494,088 1/1985 Gontowski, Jr. et al. .......... 331/111
4,607,238 8/1986 Kohsiek ....................... 331/111 X Primary Examiner—Eugene R. LaRoche
Assistant Examiner—Robert J. Pascal
Attorney, Agent, or Firm—Robert M. Asher

[57] ABSTRACT

A precision oscillator circuit with synchronous capability. The circuit receives a predetermined discharging voltage and a predetermined charging voltage for setting a precise discharging and charging rate. A comparator in the oscillator contains three transistors connected to each other at their emitters. A latch circuit is provided on two of the transistors for accelerating the speed with which they turn on. An overshoot correction circuit provides additional charging current when the timing capacitor has dropped below the valley voltage threshold. Synchronizing pulses are generated at the capacitor terminal to allow for a plurality of oscillators to operate synchronously when connected in parallel.

39 Claims, 4 Drawing Figures

HIGH FREQUENCY PRECISION OSCILLATOR WITH SYNCHRONOUS CAPABILITY

BACKGROUND OF THE INVENTION

This invention relates to oscillator circuits.

Current mode control integrated circuits, for use in fixed-frequency power supply applications require as one of the circuit functions, an oscillator that can be easily programmed to provide a precise timing signal. The need for a precise timing signal is two-fold. In order to minimize the power supply output voltage ripple, filtering components are chosen for the nominal operating frequency. Any deviation from the nominal frequency will result in increased output ripple. Secondly, it is necessary to limit the maximum on-time of the switching transistor in order to prevent core saturation and ultimately a catastrophic failure.

The oscillator should also be capable of several decades of operating frequencies in order to be useful in many applications. As the switching times of the external components are reduced, higher oscillator frequencies are required to take advantage of the smaller filtering components associated with high frequency operation.

A relaxation oscillator of the prior art in its simplest form is shown in FIG. 1. Transistor 10 and transistor 11 form a comparator. The base of transistor 10 is connected to an RC terminal 22. A timing capacitor 12 and a charging resistor 13 are connected to the oscillator circuit at the RC terminal 22. A transistor 17 has an emitter connected to the voltage supply terminal 14. A resistor 23 is connected between the emitter and the base of transistor 17. Another resistor 24 is connected at one end to the collector of transistor 17, the base of a transistor 15 and the base of a transistor 16. The other end of resistor 24 is connected to ground.

The timing capacitor 12 is charged through the charging resistor 13 towards the voltage at the voltage supply terminal 14. While the capacitor 12 is charging, transistor 15, transistor 10, transistor 16 and transistor 17 are non-conducting. The base of transistor 11 is at the upper voltage limit of the oscillator waveform as determined by resistors 18 and 19. When the voltage on the timing capacitor 12 reaches the upper voltage limit, transistor 10 turns on and transistor 11 turns off. This causes transistor 17, transistor 15, and transistor 16 to fully conduct.

Transistor 16 essentially places a resistor 20 in parallel with resistor 19 thereby lowering the voltage at the base of transistor 11 to the bottom voltage of the oscillator waveform. With transistor 15 on, a discharging resistor 21 will provide a discharge path for the timing capacitor 12. When the timing capacitor 12 has a potential which has dropped to the bottom voltage, transistor 11 turns on and transistor 10 turns off and the cycle repeats.

While this simple oscillator has been implemented in many circuit designs, it suffers from a number of deficiencies. There is often caused an error in the bottom voltage of the waveform. When transistor 16 turns on, there is a voltage drop across its collector to emitter, the saturation voltage. This voltage varies due to manufacturing tolerances and operating temperature. Present manufacturing techniques tolerate a 30% error in the saturation voltage across a transistor in an integrated circuit. The error caused by providing a transistor 16 in the resistor network which determines the bottom voltage of the waveform is most troublesome when the supply voltage 14 is low.

There may also be an error in the discharge current which causes an error in the timing of the waveform. The collector-emitter voltage of transistor 15 when turned on can introduce an error in the amount of discharge current that is available through the discharge resistor 21.

Especially noticeable at high operating frequencies is the problem of propagation delay error. When the voltage on timing capacitor 12 voltage drops to the bottom voltage, transistor 15 and transistor 16 should ideally turn off instantly allowing the capacitor to start charging. However, since transistor 15 and transistor 16 have been operating in the saturation region, there is a finite time required to completely turn them off. Thus the capacitor will continue to discharge below the bottom voltage. The higher the operating frequency the more pronounced this error becomes because under high frequency operation the voltage is changing more quickly.

A further disadvantage of this prior art circuit is that it has a dependence on a propagation delay. If transistor 15 were able to switch much faster than transistor 16, as soon as the capacitor voltage reached the top voltage, transistor 15 would turn on causing the capacitor voltage to decrease before transistor 16 was able to turn on. The oscillator would then assume a stable state with the capacitor voltage near the top voltage. To guarantee switching, a delay must be designed into transistor 15 to insure that transistor 16 turns on to change the comparator reference voltage before the capacitor is discharged. In the prior art designs, the discharge transistor 15 is generally made larger in size than transistor 16. This causes transistor 16 to switch faster than transistor 15 insuring that the threshold will change before the capacitor charge-to-discharge cycle begins. This dependence of the prior art circuit upon propagation delay for reliable operation causes absolute frequency shifts at higher frequencies thereby limiting the operation of these circuits to a lower frequency range.

In certain applications, it is desirable to connect two or more controllers in parallel to increase the output power capabilities. This requires one of the controller's oscillator circuits to act as the master while the other controllers are slaves. A method of synchronizing the frequency of the slaves to the master is required. A plurality of prior art oscillator circuits cannot simply be connected at their RC terminals 22. Because of manufacturing tolerances the top and bottom thresholds are different for each of the oscillators. Therefore, if the RC terminal is used for all of the oscillators only the oscillator with the lowest top or highest bottom voltage would actually switch states. In the prior art to remedy this situation, oscillators usually included a separate synchronizing input/output terminal to provide a well-defined clock pulse which would cause all of the oscillators to switch simultaneously. The disadvantage of this scheme is that additional circuitry and an additional device pin are required for its implementation.

SUMMARY OF THE INVENTION

This invention is directed to a high frequency precision oscillator with synchronous capability. The oscillator includes a comparator for comparing the voltage of a timing capacitor with peak and valley voltage thresholds. Circuitry is provided for charging and discharging the timing capacitor. The comparator switches the operation of the circuit from charging to discharging when the thresholds are reached.

According to the present invention, a charging voltage and a discharging voltage are received by the oscillator. By receiving these fixed voltages, the voltage across the charging resistor and the discharging resistor are set at fixed values so that the charging and discharging currents are set precisely. The discharge current error encountered by the prior art is thus avoided.

According to a further feature of the present invention, a latch is provided connected to at least one of the transistors in the comparator of the circuit so that as soon as the transistor begins to turn on, the latch accelerates the turning on and forces that transistor to stay on. This avoids the problem in the prior art circuit caused by propagation delay in which one transistor of the comparator does not turn on as quickly as another of the transistors. In the prior art circuit of FIG. 1, the capacitor voltage can be caught hanging near one of the thresholds and oscillation stops. By latching a transistor on, the threshold will have time to change so that oscillation will continue throughout the oscillator operation.

A still further feature of the invention is an overshoot correction circuit. During high frequency oscillation, the capacitor discharging through a transistor may be discharging so quickly that its voltage falls below the valley voltage. The circuit of the present invention provides circuitry which is activated by the comparator when the timing capacitor has a potential below the valley. The activated circuit accelerates the charging up of the capacitor until the overshoot has been corrected.

A still further feature of the present invention is that circuitry is connected to the comparator for providing synchronizing pulses at the upper and lower peaks of the oscillation. These pulses may be used when running a plurality of oscillator circuits in parallel. The oscillator circuits may each be connected to one another at their respective capacitor terminal. The synchronizing pulse insures that each of the oscillators continues to oscillate properly regardless of manufacturing tolerance which may give each of the oscillators different thresholds.

Other objects and advantages of the invention will become apparent during the following description of the presently preferred embodiment of the invention taken in conjuction with the drawings.

BRIEF DESCRIPTON OF THE DRAWINGS

DETAILED DESCRIPTION OF THE PREFERRED EMBODIMENT

Figure 2:
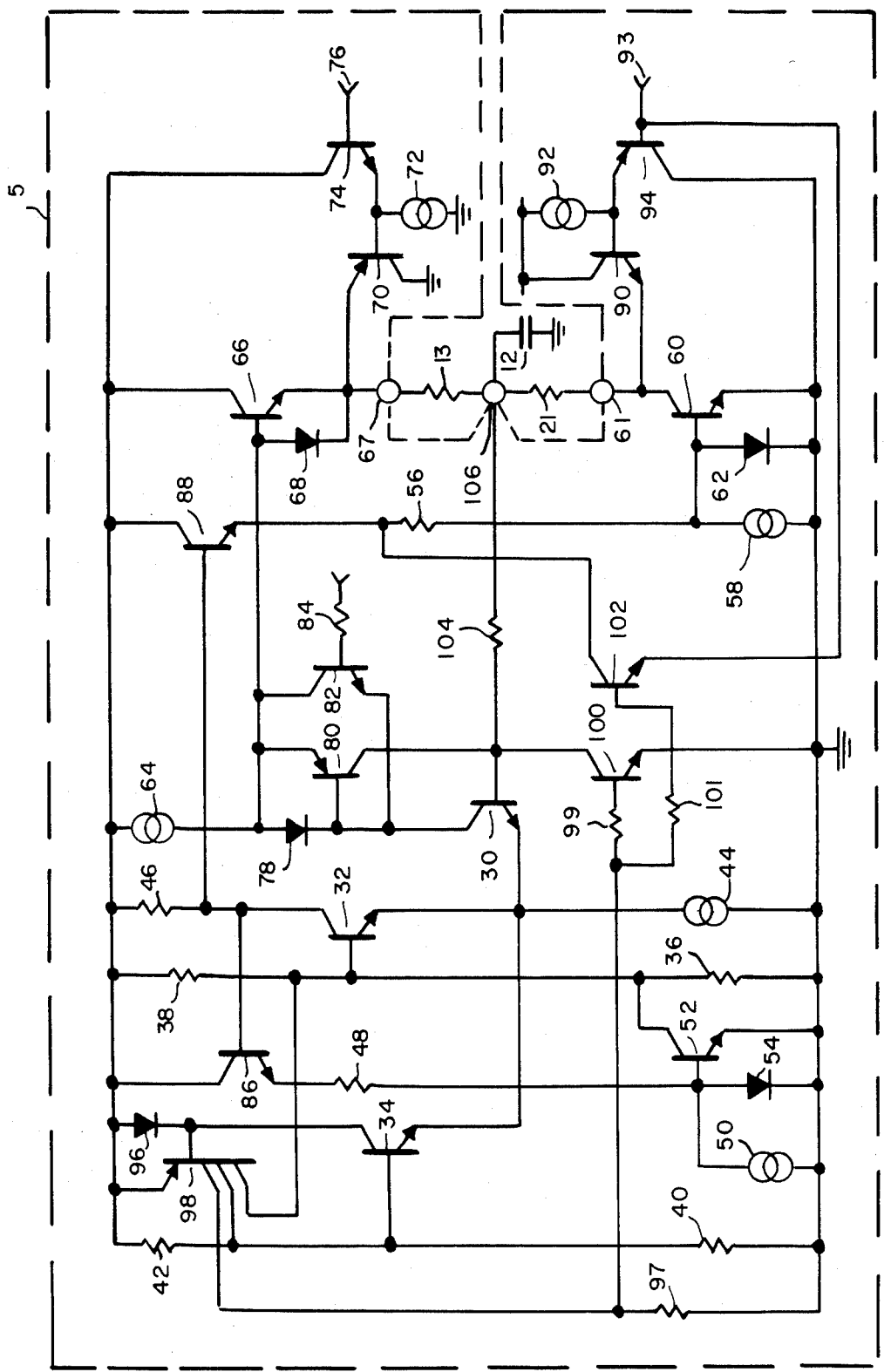
FIG. 2 is a simplified diagram of an oscillator circuit of the present invention.

Referring now to FIG. 2, a schematic of an oscillator circuit 5 of the present invention is shown. A multi-input comparator is formed by a first transistor 30, a second transistor 32 and a third transistor 34. The emitters of each of the three transistors are connected together. A current source 44 is connected between ground and the junction of these three emitters. The transistor of the three transistors in the multi-input comparator having its base at the voltage higher than the base voltages of the other two transistors is the only transistor which is on. The emitter of the one transistor raises the voltage at the emitters of the other two transistors so that they remain off. Thus, only one of the three transistors may be on at one time.

The peak voltage threshold of the oscillator is set by a resistor divider network formed by the resistor 36 and resistor 38. In the presently preferred embodiment, the peak voltage threshold is 3 volts as set at the base of second transistor 32 by resistors 36 and 38. The valley voltage threshold is set by the resistor divider network made up of resistor 40 and resistor 42. In the presently preferred embodiment, the valley voltage threshold is two volts at the base of the third transistor 34.

At the beginning of the oscillator cycle, the timing capacitor 12 connected to the oscillator at capacitor terminal 106 is initially at zero volts and the base of the second transistor 32 is at the peak voltage threshold. The base of the first transistor 30 is connected to the timing capacitor 12 through resistor 104. The second transistor 32 is conducting all of the current set by the current source 44. Since the base of the second transistor 32 is at the highest potential of the bases of the three comparator transistors, it is the one which conducts. The peak voltage threshold is switched on and off by circuitry including a transistor 86, a resistor 48, a current source 50, a diode 54 and a transistor 52. The collector of transistor 52 is connected to the resistor divider network of resistor 38 and resistor 36 so that when transistor 52 is turned on, the voltage at the base of second transistor 32 is reduced. This turns second transistor 32 off so that the peak voltage threshold is effectively removed from the circuit.

The current through transistor 32 causes a voltage drop across resistor 46. This lowers the voltage at the top of resistor 48. The voltage across resistor 48 has thus been lowered so as to develop a current that is less than the amount required through the current source 50. This causes current source 50 to go to compliance, thereby keeping transistor 52 and diode 54 out of conduction. In other words, all the current through resistor 48 goes through the current source 50 and none goes through the transistor 52 and diode 54. Thus, transistor 52 is off and the peak voltage threshold is set at its correct value.

A circuit for supplying discharge current is provided by a transistor 88, a resistor 56, a current source 58, a diode 62 and a transistor 60. The transistor 60 and diode 62 are configured as a current multiplier. The collector of transistor 60 is connected to a discharge terminal 61 for making connection to the externally provided discharge resistor 21. With transistor 32 on, the current through resistor 46 causes a voltage drop which lowers the voltage at the top of resistor 56. This reduces the current through resistor 56 to an amount which is less than that required by the current source 58. Therefore, current source 58 goes to compliance and all of the current from resistor 56 goes through the current source 58. None of the current moves through transistor 60 and diode 62. Thus, the discharge current circuitry is off while the second transistor 32 is on.

Since the first transistor 30 is not conducting while second transistor 32 is on, the current source 64 supplies current to a capacitor charging circuit which is comprised of a transistor 66 and a diode 68 in a current multiplier configuration. Working in conjunction with th charging circuit is the charging voltage setting circuit which includes a transistor 70, a current source 72, a transistor 74 and a conductive line 76 for receiving a precise predetermined charging voltage. With the first transistor 30 off, the current from the current source 64 is provided to the charging diode 68. The diode 68 and the charging transistor 66 are connected as a current multiplier for supplying current to the external charging resistor 13 through a charging terminal 67. In the presently preferred embodiment, the charging transistor 66 is configured to deliver 3 times the current through diode 68. Thus a total of 4 times the current delivered by current source 64 is available to the charging resistor 13 from the charging circuit of transistor 66 and diode 68. In the presently preferred embodiment, the current source 64 provides 375 microamps and thus a total of 1.5 milliamps is available through the charging circuit. The available charging current can be split between the charging resistor 13 and the transistor 70 of the voltage setting circuit.

Transistor 70 and transistor 74 form a buffered clamp capable of sink-only operation. The predetermined charging voltage at the base of transistor 74 appears at the emitter of transistor 70 whenever current is available from the charging circuit. Thus, when the charging circuit is on, the charging voltage, 4 volts in the presently preferred embodiment, appears at the terminal connected to the charging resistor 13. Since the charging voltage is derived from a precision reference and the timing components—charging resistor 13 and timing capacitor 12—are external components to the integrated circuit, the integrated circuit may be used in oscillators requiring tight tolerances. The charging current and subsequently the charging time is well-defined by the predetermined charging voltage at the one end of the charging resistor 13.

The first transistor 30 starts conducting when the voltage at its base rises to the voltage at the base of the second transistor 32. Thus, when the timing capacitor 12 charges up to a voltage approaching the peak voltage threshold at the base of the second transistor 32, the first transistor 30 starts conducting. A latch circuit is provided to ensure that first transistor 30 turns on quickly and stays on. The latch circuit includes a current mirror formed by a diode 78 and a transistor 80. A transistor 82 is provided with a base connected through a resistor 84 to a voltage high enough for use in turning off the latch circuit. The voltage attached to resistor 84 in the presently preferred embodiment is the 4 volt charging voltage. When current begins flowing through the first transistor 30, the current mirror formed by the diode 78 and transistor 80 increases the current into transistor 30. Resistor 104 impedes the current from transistor 80 from going into the timing capacitor 12 so that the current is used to turn on transistor 30. The rapid rise in current through transistor 30 causes the voltage at the collector of the first transistor 30 to fall rapidly. When the collector of the first transistor 30 drops to 3.3 volts transistor 82 is turned on thereby turning off the current mirror. The current from current source 64 now flows through transistor 82 into the first transistor 30.

As the first transistor is turned on, the second transistor 32 is turned off. Current source 44 limits the current through the three transistors in the multi-input comparator. When current begins flowing through first transistor 30, the current through second transistor 32 is reduced. Thus, the voltages at the bases of transistor 86 and transistor 88 begin to rise towards the supply voltage. Transistor 86 facilitates positively shutting off second transistor 32 and transistor 88 turns on the discharging circuit. The higher voltages at these transistors translate into higher currents through resistor 48 and resistor 56, respectively. The increased current through resistor 48 is more than current source 50 can sink. The remaining current flows through diode 54 and is mirrored by transistor 52. The component values are set such that this current drops the voltage at the junction between resistor 38 and resistor 36 to a potential below the valley voltage threshold. Since the base for the second transistor 32 is also connected at this junction the reduction in voltage ensures that the second transistor 32 is off. The voltage at the junction remains high enough so that transistor 52 is not in saturation. This allows for rapidly switching transistor 52 off when the discharge cycle ends.

The increased current from transistor 88 through resistor 56 is more than current through resistor 48 is more than current source 50 can sink. The remaining current flows through diode 54 and is mirrored by transistor 52. The component values are set such that this current drops the voltage at the junction between resistor 38 and resistor 36 to below the lower peak voltage. Since the base for the second transistor 32 is also connected at this junction the reduction in voltage ensures that the second transistor 32 is off.

The increased current from transistor 88 through resistor 56 is more than current source 58 can sink. The excess current flows through diode 62. Transistor 60 is provided with a plurality of emitters so as to act as a current multiplier. In the presently preferred embodiment, the transistor 60 is an 8-times multiplier and when current is flowing through diode 62 the collector of the transistor 60 is capable of receiving one and one-half milliamps. The collector of transistor 60 is connected to a terminal for connection to the external discharging resistor 21. Thus, discharging current is pulled through the discharge resistor 21 by the transistor 60.

In order to provide a precise rate of discharging, a discharge voltage setting circuit is provided by transistor 90 current source 92 and transistor 94. A line 93 at the base of transistor 94 receives a discharge voltage. The presently preferred discharge voltage is one volt. Transistor 90 and transistor 94 form a buffered clamp holding the collector of transistor 60 at one volt. By fixing this voltage, at the bottom of the discharge resistor 21 a precise discharge current is set. However, if the discharge resistor 21 is so small that the current determined by the discharge voltage setting circuit exceeds the current available from the current multiplier of transistor 60 and diode 62, then the discharge current will be that determined by the current multiplier. The current multiplier thus limits the discharge current to a fixed value when the discharge resistor 21 is small or is replaced by a short.

When the voltage across the timing capacitor drops so as to approach the valley voltage threshold set by the resistor divider formed by resistors 40 and resistor 42 at the base of the third transistor 34, the third transistor 34 begins conducting. A latch circuit is provided at the third transistor 34 to accelerate and hold transistor 34 in conduction. The latch circuit is formed by a diode 96 and a transistor 98 which are configured as a current mirror. Once current begins flowing through transistor 34, the current mirror increases that current thereby turning transistor 34 fully on. A portion of the current produced by transistor 98 is provided through resistor 40 to raise the voltage at the base of the third transistor 34. Therefore, the third transistor 34 quickly turns on while the first transistor 30 is turning off. A further increase in switching speed is achieved by transistor 100 which receives current from the transistor 98 through a resistor 99. The transistor 100 then acts to pull down on the base of the first transistor 30 speeding up the turn-off of that transistor. A resistor 97 is connected between ground and the emitter of transistor 98 which is also connected to resistor 99.

At the same time that the first transistor 30 and third transistor 34 are being switched, current is being fed from transistor 98 into the junction of resistor 36 and resistor 38. This raises the potential at the base of the second transistor 32 quickly turning it on and thereby turning off the third transistor 34. This quick turn on of second transistor 32 is possible since transistor 52 is not saturated.

When the oscillator is operating at high frequency, delay between the turning on of the third transistor 34 and the turning on of the second transistor 32 will cause the timing capacitor 12 to overshoot the valley voltage threshold. To correct for this overshoot, current is also injected by the transistor 98 into a base of transistor 102 through a resistor 101. The collector of transistor 102 is connected above the resistor 56 and the emitter of transistor 102 is connected to the base of transistor 94 which receives the discharging voltage through line 93. At this time in the oscillator cycle, the emitter of transistor 88 and therefore the collector of transistor 102 is at about 3.3 volts. With transistor 102 turned on, this voltage pulls up on the base of transistor 94 which in turn pulls up on the voltage at the emitter of transistor 90. Thus, charging current in addition to that provided by the charging circuitry, will be forced through the discharging resistor 21 onto the timing capacitor 12. This will accelerate the charging of the timing capacitor 12 so as to compensate for the overshoot. As the second transistor 32 turns on, current is brought through resistor 46 which lowers the voltage at the base of transistor 88 thereby lowering the voltage at the collector of transistor 102 so that it no longer is affecting transistor 94 and the remainder of the discharging voltage setting circuitry. Once the correction has been made, transistor 102 stops pulling up on transistor 94 and the only charging current will be provided by the charging circuitry through the charging resistor 13. With the second transistor 32 back on, the oscillator cycle repeats.

Figure 1:
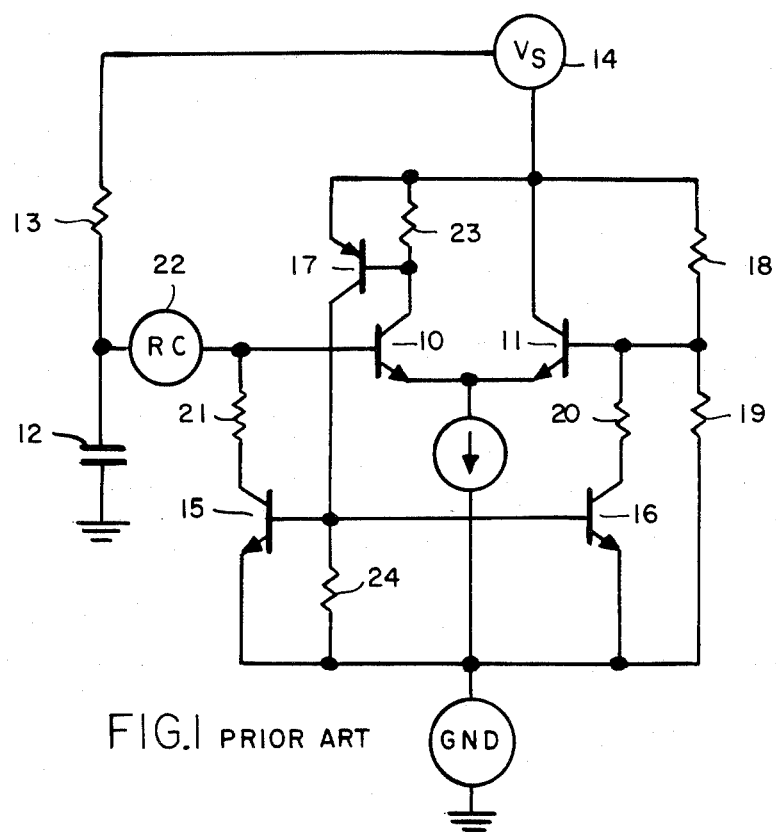
FIG. 1 is a simplified schematic diagram of an oscillator circuit of the prior art.
Figure 3:
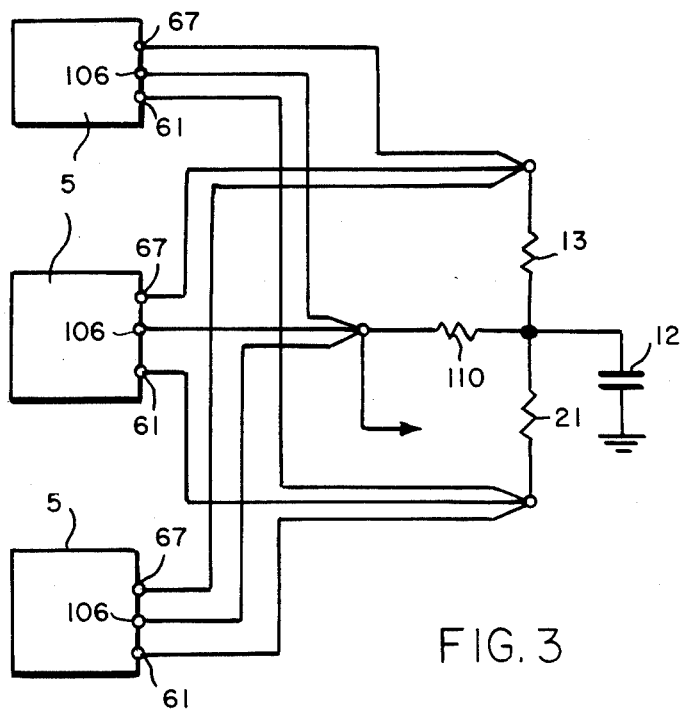
FIG. 3 is a simplified schematic diagram of a plurality of oscillator circuits of the present invention connected in parallel.

Referring now to FIG. 3, a schematic is shown which demonstrates how plurality of oscillators of the present invention may be connected at their respective capacitor terminal 106 for synchronous operation. Each of the oscillator circuits is connected to the external circuitry shown including a charging resistor 13, a discharging resistor 21, a timing capacitor 12 and a sync resistor 110. The sync resistor 110 is connected between the timing capacitor 12 and the capacitor terminal 106 of each of the oscillator circuits. Charging resistor 13 is connected to the charging terminal 67 of each of the oscillator circuits 5. Discharging resistor 21 is connected to the discharge terminals 61 of each of the oscillators. When connected in this manner a spike or pulse is formed at the peaks and valleys of the timing capacitor oscillation at the capacitor terminals 106. The spike or synchronizing pulse provided at each of the peaks and valleys overcomes problems ordinarily caused by manufacturing tolerances which give the various oscillator circuits hooked up in parallel slightly different thresholds. The synch pulse will ensure at each peak or valley that all of the oscillator circuits switch. The positive sync pulse at the peak voltage is formed by the current mirror formed by diode 78 and transistor 80. When the first transistor 30 starts to turn on for one of the oscillator circuits in the hook-up, the current mirror in that circuit multiplies the current and provides extra current such that a spike appears at the capacitor terminals 106 when this current moves through the synchronizing resistor 110. Once the voltage at the collector of the first transistor 30 gets low enough, the transistor 82 turns on, turning off the current mirror and thereby turning off the sync pulse.

At the valley voltage of the oscillation, transistor 100 is turned on by current from the transistor 98. Transistor 100 pulls current through it from the synchronizing resistor 110 thereby creating a negative spike or negative synchronizing pulse. When second transistor 32 turns on, transistor 98 turns off thereby shutting off transistor 100 and terminating the negative sync pulse. As described, the oscillator circuits of the present invention can be hooked-up in parallel and synchronized using the basic terminals. A separate synchronizing terminal or pin is not necessary.

Figure 4:
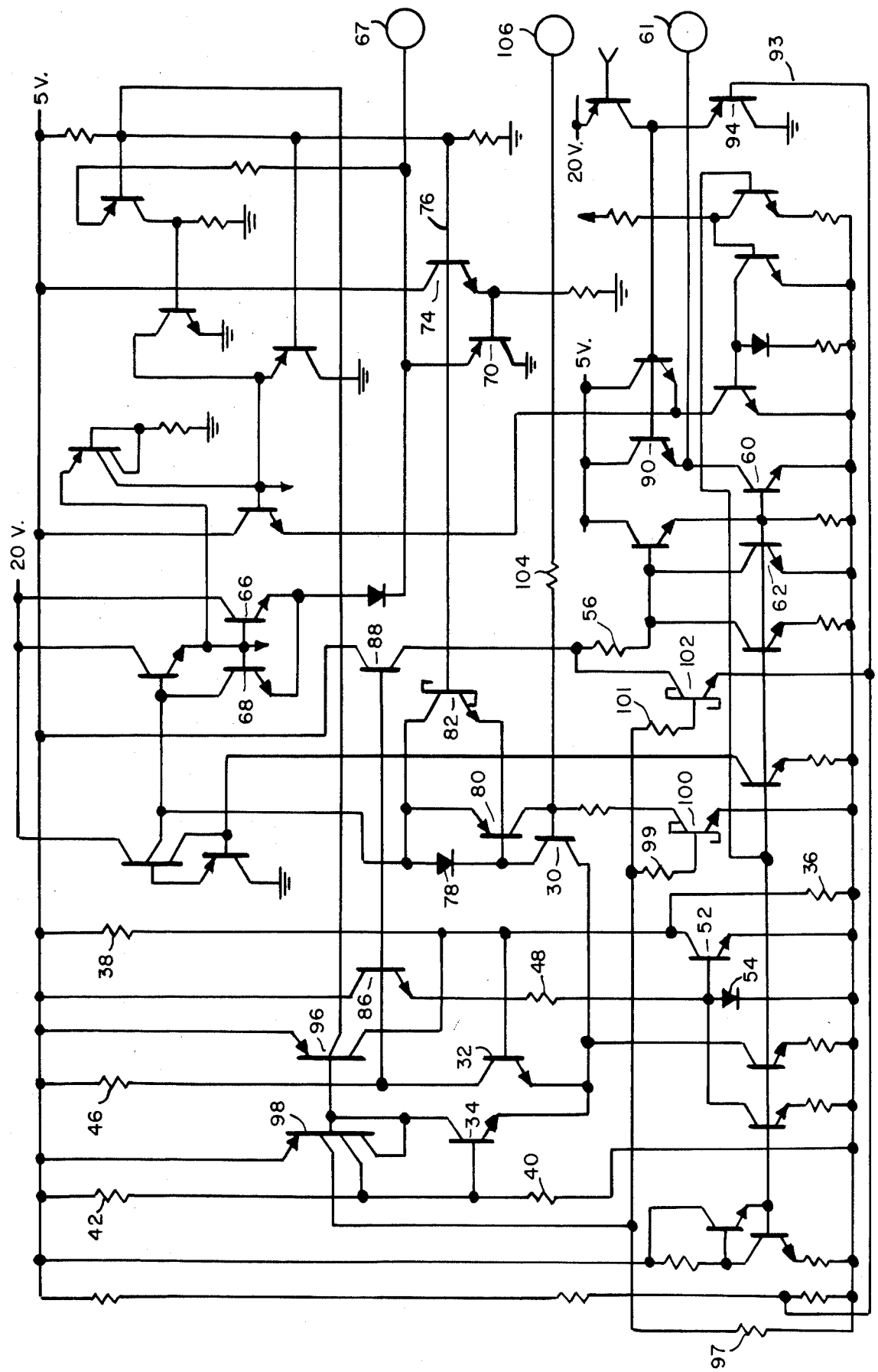
FIG. 4 is a schematic diagram of a oscillator circuit of the present invention.

A complete schematic diagram of the presently preferred embodiment of the oscillator circuit of the present invention is shown in FIG. 4. This circuit operates as described for the simplified diagram of FIG. 2. Components corresponding to those identified in FIG. 2 are labeled accordingly.

Thus, there has been described above a new and improved oscillator integrated circuit having significant advantages over previous circuits in the prior art for controlling oscillation. It should be appreciated that modifications to the described embodiment may be made by those of ordinary skill applying the principles of the present invention to different applications. Accordingly, the present invention should not be considered to be limited by the description herein of the preferred embodiment, but rather should be interpreted in accordance with the following claims.

I claim:

1. An oscillator circuit for coupling to a capacitor comprising:

means for setting a peak voltage threshold;

means for setting a valley voltage threshold;

charging current source means for supplying a charging current through a charging terminal to said capacitor;

charging voltage means for receiving a predetermined charging voltage and for maintaining said charging terminal at said predetermined charging voltage whenever said charging current source means is on;

discharging current source means for pulling a discharging current from said capacitor through a discharge terminal;

discharging voltage means for maintaining said discharge terminal at a predetermined discharging voltage whenever said discharging current source means is on; and comparator means for switching said charging current source means on and said discharging current source means off in repsonse to said capacitor dropping to a voltage approaching said vally voltage threshold and for switching said charging current source means off and said discharging current source means on in response to said capacitor rising to a voltage approaching said peak voltage threshold.

2. The oscillator of claim 1 wherein said charging current source means comprises a current multiplier.

3. The oscillator of claim 1 wherein said charging voltage means comprises:
a first transistor having an emitter connected to the charging terminal and having a base;
a second transistor having a base connected to said predetermined charging voltage and an emitter connected to the base of said first transistor; and
a current source connected to the emitter of said second transistor and to the base of said first transistor.

4. The oscillator of claim 1 wherein said discharging current source means comprises a current multiplier.

5. The oscillator of claim 1 wherein said discharging voltage means comprises:
a first transistor having an emitter connected to the discharge terminal and having a base;
a second transistor having a base connected to said predetermined discharging voltage and an emitter connected to the base of said first transistor; and
a current source connected to the emitter of said second transistor and to the base of said first transistor.

6. The oscillator of claim 1 wherein said comparator means comprises three transistors each having an emitter connected to the emitters of the other two transistors, said transistors being connected such that no more than one of the three transistors may be fully on at one time.

7. The oscillator of claim 6 further comprising a current mirror connected to the collector of one of said three transistors so that when said one of said three transistors begins to turn on, said current mirror provides additional current through said transistor to accelerate its turning on.

8. The oscillator circuit of claim 1 wherein said means for setting a peak voltage threshold comprises two resistors connected in series between ground and a source voltage.

9. The oscillator of claim 8 further comprising a transistor connected in parallel with the resistor of said peak voltage threshold setting means which is connected to ground, said transistor being provided for lowering the voltage set by the two resistors when said oscillator circuit is discharging said capacitor and means for preventing said transistor from saturating.

10. The oscillator of claim 1 further comprising overshoot correction means connected to said discharging voltage means for pulling up the voltage on said discharging voltage means when said capacitor overshoots the valley voltage threshold.

11. An oscillator circuit having a capacitor terminal for coupling to a capacitor comprising:
means for charging said capacitor;
means for discharging said capacitor;
means for setting a peak voltage threshold;
means for setting a valley voltage threshold;
comparator means formed by a first transistor having a base coupled to said capacitor terminal, an emitter and a collector, a second transistor having a base connected to said means for setting a peak voltage threshold, an emitter connected to the emitter of said first transister and a collector, and a third transistor having a base connected to said means for setting a valley voltage threshold, an emitter connected to the emitters of said first and second transistors and a collector, said three transistors being connected so that no more than one of said three transistors may be turned fully on at the same time;
means for coupling said comparator means to said means for charging and said means for discharging so that in response to said capacitor dropping to a voltage approaching said valley voltage threshold said means for charging is turned on and in response to said capacitor rising to a voltage approaching said peak voltage threshold said means for charging is turned off and said means for discharging is turned on; and
latch means connected to the base and the collector of one of said three transistors for accelerating the turning on of said one of said three transistors after it begins to turn on.

12. The oscillator of claim 11 further comprising means for turning off said latch means.

13. The oscillator of claim 12 wherein said one of said three transistors is said first transistor and said turning off means comprises a transistor connected in parallel with said latch means having an emitter connected to the collector of said first transistor so that when the voltage at the collector of said first transistor falls to a predetermined voltage, said transistor turns on thereby routing current around said latch means.

14. The oscillator of claim 11 wherein said latch means comprises a current mirror.

15. The oscillator of claim 14 wherein said one of said three transistors is said first transistor and said current mirror provides a current pulse to said capacitor terminal when said capacitor approaches said peak voltage.

16. The oscillator of claim 11 further comprising a current mirror connected to the base and the collector of said third transistor for accelerating the turning on of said third transistor after it begins to turn on 17. The oscillator of claim 16 further comprising means, connected to receive current from said current mirror, for creating a negative current pulse at said capacitor terminal when said capacitor approaches said valley voltage threshold.

18. The oscillator of claim 16 wherein said means for setting a peak voltage threshold comprises a first resistor connected between a source voltage and the base of said second transistor and a second resistor connected between ground and the base of said second transistor.

19. The oscillator of claim 18 further comprising a transistor having a collector connected to the base of said second transistor and an emitter connected to ground, said transistor being connected so as to lower the voltage at the base of said second transistor when said second transistor is off.

20. The oscillator of claim 19 further comprising means for preventing said transistor from saturating.

21. The oscillator of claim 19 further comprising means for providing current from said current mirror to the base of said second transistor so as to turn on said second transistor raising the voltage at the base of said second transistor up towards said peak voltage threshold.

22. The oscillator of claim 16 further comprising overshoot correction means responsive to current from said current mirror for causing current to be supplied to said capacitor until said second transistor is turned on.

23. An oscillator circuit having a capacitor terminal for coupling to a capacitor comprising:

means for setting a peak voltage threshold;
means for setting a valley voltage threshold;
means for charging said capacitor;
means for discharging said capacitor;
comparator means formed by three transistors connected such that no more than one of said transistors may be turned fully on at one time, including:
a first transistor having a base coupled to said capacitor terminal, an emitter and a collector;
a second transistor having a base connected to said means for setting a peak voltage threshold, an emitter connected to the emitter of the first transistor and a collector; and
a third transistor having a base connected to said means for setting a valley voltage threshold, an emitter connected to the emitters of said first and second transistors and a collector;
means for coupling said comparator means to said means for charging and said means for discharging so that in response to said capacitor dropping to a voltage approaching said valley voltage threshold said means for charging is turned on and in response to said capacitor rising to a voltage approaching said peak voltage threshold said means for charging is turned off and said means for discharging is turned on; and
overshoot correction means for accelerating the charging of said capacitor to correct for excessive discharging of said capacitor, said overshoot correction means turning on in response to said third transistor turning on and said overshoot correction means turning off in response to said second transistor turning on.

24. The oscillator circuit of claim 23 wherein said means for discharging includes means for receiving a predetermined discharging voltage for setting the voltage at a discharge terminal and a current multiplier for limiting the current at said discharge terminal.

25. The oscillator circuit of claim 24 further comprising a current mirror connected to the base and the collector of said third transistor for accelerating the turning on of said third transistor after it begins to turn on.

26. The oscillator circuit of claim 25 wherein said overshoot correction means comprises a transistor having a base coupled to receive current from said current mirror, a collector having a voltage related to the current in said second transistor and an emitter connected to said means for receiving said predetermined discharging voltage.

27. An oscillator circuit having a capacitor terminal for coupling to a capacitor comprising:
means for setting a peak voltage threshold;
means for setting a valley voltage threshold;
means for charging said capacitor;
means for discharging said capacitor;
comparator means formed by three transistors connected such that no more than one of said transistors may be turned on at one time, including:
a first transistor having a base coupled to said capacitor terminal, an emitter and a collector;
a second transistor having a base connected to said means for setting a peak voltage threshold, an emitter connected to the emitter of the first transistor and a collector; and
a third transistor having a base connected to said means for setting a valley voltage threshold, an emitter connected to the emitters of said first and second transistors and a collector;
means for coupling said comparator means to said means for charging and said means for discharging so that in response to said capacitor dropping to a voltage approaching said valley voltage threshold said means for charging is turned on and in response to said capacitor rising to a voltage approaching said peak voltage threshold said means for charging is turned off and said means for discharging is turned on;
means for generating a positive pulse of current at said capacitor terminal when said capacitor approaches said peak voltage; and
means for generating a negative pulse of current at said capacitor terminal when said capacitor approaches said valley voltage.

28. The oscillator circuit of claim 27 wherein said means for generating a positive pulse comprises a current mirror connected to the collector and the base of said first transistor.

29. The oscillator circuit of claim 28 further comprising a transistor connected in parallel with said current mirror and having an emitter connected to the collector of said first transistor, said transistor turning on so as to direct current around said current mirror when the collector of said first transistor has a voltage that has dropped below a predetermined level.

30. The oscillator circuit of claim 27 further comprising a current mirror connected to the base and the collector of said third transistor.

31. The oscillator circuit of claim 30 wherein said means for generating a negative pulse comprises a transistor having a collector connected to the base of said first transistor and a base connected to said current mirror.

32. The oscillator circuit of claim 30 wherein said means for setting a peak voltage threshold comprises a first resistor connected between a source voltage and the base of said second transistor and a second resistor connected between ground and the base of said second transistor.

33. The oscillator circuit of claim 32 further comprising a transistor having a collector connected to the base of said second transistor and an emitter connected to ground, said transistor being connected so as to lower the voltage at the base of said second transistor when said second transistor is off.

34. The oscillator circuit of claim 33 further comprising means for preventing said transistor from saturating.

35. The oscillator circuit of claim 33 further comprising means for providing current from said current mirror to the base of said second transistor so as to turn on said second transistor by raising the voltage at the base of said second transistor up towards said peak voltage threshold.

36. The oscillator circuit of claim 27 wherein said means for charging said capacitor comprises a current multiplier and charging voltage means for receiving a predetermined charging voltage.

37. The oscillator circuit of claim 36 wherein said charging voltage means comprises:
a first charging voltage transistor having an emitter connected to the charging terminal and having a base;
a second charging voltage transistor having a base connected to said predetermined charging voltage and an emitter connected to the base of said first charging voltage transistor;

a current source connected to the emitter of said second transistor and to the base of said first transistor.

38. The oscillator circuit of claim 27 wherein said means for discharging said capacitor comprises a current multiplier and discharging voltage means for receiving a predetermined discharging voltage.

39. The oscillator circuit of claim 38 wherein said discharging voltage means comprises:

a first discharging voltage transistor having an emitter connected to the discharge terminal and having base;
a second discharging voltage transistor having a base connected to said predetermined discharging voltage and an emitter connected to the base of said first discharging voltage transistor; and
a current source connected to the emitter of said second transistor and to the base of said first transistor.

* * * * *